(12) United States Patent
Wingo

(10) Patent No.: US 6,409,897 B1
(45) Date of Patent: Jun. 25, 2002

(54) ROTATABLE SPUTTER TARGET

(75) Inventor: Larry S. Wingo, Rhome, TX (US)

(73) Assignee: Poco Graphite, Inc., Decatur, TX (US)

( * ) Notice: Subject to any disclaimer, the term of this patent is extended or adjusted under 35 U.S.C. 154(b) by 0 days.

(21) Appl. No.: 09/666,977

(22) Filed: Sep. 20, 2000

(51) Int. Cl.[7] .................. C23C 14/34; B29D 22/00; B29D 23/00; B32B 1/08

(52) U.S. Cl. ............... 204/298.13; 204/298.12; 204/298.28; 428/34.1; 428/35.7; 428/36.4

(58) Field of Search ............... 204/298.12, 298.13, 204/298.28; 428/34.1, 35.7, 36.4

(56) References Cited

U.S. PATENT DOCUMENTS

| | | | |
|---|---|---|---|
| 4,135,286 A | 1/1979 | Wright et al. ........... | 29/420 |
| 4,422,916 A | 12/1983 | McKelvey ............ | 204/192 R |
| 4,443,318 A | 4/1984 | McKelvey ............ | 204/298 |
| 5,096,562 A | 3/1992 | Boozenny et al. ..... | 204/298.22 |
| 5,284,539 A | 2/1994 | McKernan et al. ..... | 156/154 |
| 5,428,882 A | 7/1995 | Makowiecki et al. ..... | 29/527.5 |
| 5,435,965 A | 7/1995 | Mashima et al. ....... | 419/8 |
| 5,453,168 A * | 9/1995 | Nelson et al. ......... | 204/192.16 |
| 5,464,518 A | 11/1995 | Sieck et al. .......... | 204/192.12 |
| 5,478,456 A * | 12/1995 | Humpal et al. ......... | 204/192.13 |
| 5,679,431 A | 10/1997 | Chen et al. ............ | 428/65.3 |
| 5,922,176 A | 7/1999 | Caskey ............... | 204/192.12 |

* cited by examiner

Primary Examiner—Steven H. VerSteeg
(74) Attorney, Agent, or Firm—Bracewell & Patterson, LLP

(57) ABSTRACT

A rotatable sputter target for use in a sputtering system having a sleeve of sputtering material attached to a structural support tube such that an annular space is formed between the inside surface of the sleeve and the outside surface of the support tube. The annular space is at least partly filled with a thermally and electrically conductive material which flows at ambient temperature. The annular space is sealed at either end so that the material cannot escape the annular space.

16 Claims, 1 Drawing Sheet

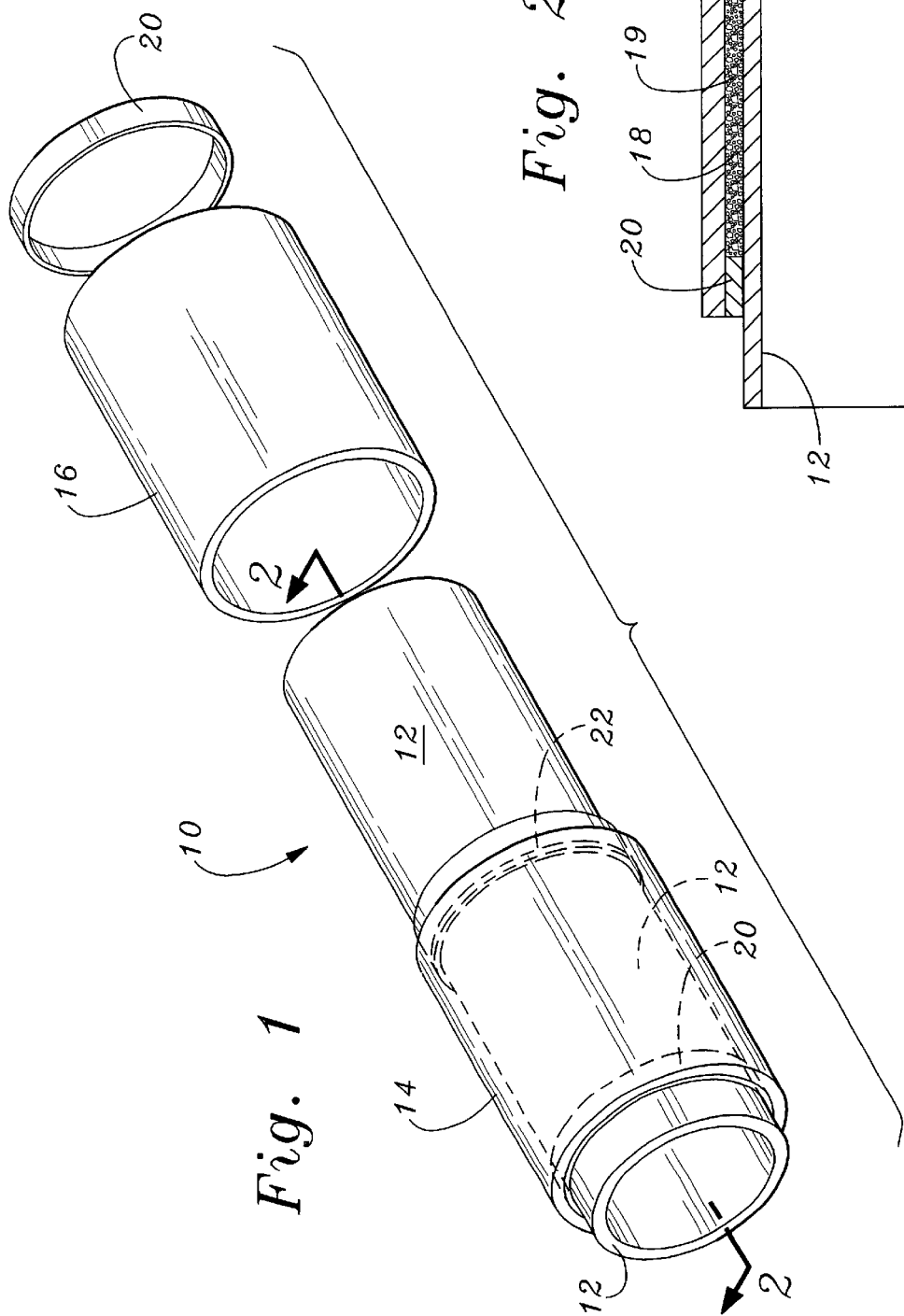

ROTATABLE SPUTTER TARGET

BACKGROUND OF INVENTION

This invention relates generally to sputter targets used in processes for the coating of substrates, such as architectural plate glass, and to methods for manufacturing these targets. The invention is particularly concerned with (1) methods for making rotatable sputter targets comprising a sputtering material, such as graphite, that is difficult to apply to a support by plasma spray or other conventional methods and (2) to the resulting sputter targets.

Sputtering is a vacuum coating process used to deposit thin films of various materials onto the surface of a desired substrate. For example, sputtering can be used to deposit thin layers of aluminum on silicon wafers used in producing integrated circuits or to deposit metals on plastic objects used in automobiles to give the objects a metallic appearance. A common use of sputtering is to coat large plates of glass with metals so the glass plates have solar properties that enable them to be used as windows in commercial buildings.

During the sputtering process the coating or sputtering material is transported from a target or source containing that material to the substrate to be coated by bombarding the surface of the target with ions of an inert gas accelerated by a high voltage. As the gas ions hit the outside surface of the target, a portion of their kinetic energy is converted to heat while another portion is imparted by momentum transfer to the atoms of the sputtering material. These atoms gain sufficient energy to overcome their bonding energy and escape from the target surface. Upon ejection from the target surface, the atoms traverse the sputtering chamber and deposit on the substrate to form a thin film.

The sputtering process is carried out in an enclosed vacuum chamber filled with an inert sputtering gas and the target, which normally comprises the sputtering material deposited on or attached to a support. The negative terminal of a power supply, usually DC or RF power, is typically connected to the sputter target, which serves as a cathode, while the positive terminal is connected to the walls of the chamber. When the system is powered up, a negative surface charge is created on the surface of the target, thereby ejecting electrons from the sputtering material. These electrons collide with atoms of the sputtering gas stripping away electrons and creating positively charged ions. The resulting combination of positively charged ions, electrons and neutral atoms is known as the sputtering gas plasma. The positively charged ions are accelerated toward the sputter target by the electrical potential between the sputtering gas plasma and the target and bombard the surface of the sputtering material carried by the target. As the ions bombard the sputtering material, atoms of the sputtering material are ejected from the target and coat the desired substrate as it is passed through the chamber.

Frequently, this sputtering process is enhanced by placing magnets behind or near the sputtering material to influence the path taken by electrons within the sputtering chamber, thereby increasing the frequency of collisions with sputtering gas atoms. Additional collisions create additional ions and further sustain the sputtering gas plasma. The apparatus employing this enhanced form of sputtering by using strategically placed magnets is known as a magnetron system.

A magnetron sputtering system can employ as its cathode either a planar, stationary sputter target or an elongated cylindrical target that is rotatable around its longitudinal axis. A disadvantage of a planar cathode is that its surface tends to erode in a relatively narrow ring-shaped region corresponding to the shape of the closed loop magnetic field formed by the magnets. This results in frequent replacement of the target. Also, it is difficult to carry out a continuous sputtering operation onto an elongated substrate, such as plate glass. The use of rotating, cylindrical sputter targets comprised of the sputtering material itself or a support tube on which the sputtering material has been deposited as the cathode overcomes these problems and results in more effective utilization of the sputtering material. Such targets are rotated relative to the magnets to selectively bring different portions of the sputtering material on the outer surface of the target into sputtering position opposite the magnets in the sputtering chamber. Normally, a cooling fluid is passed through the center of the target to cool it as it is rotated using a rotational drive mechanism. The operation of rotatable sputtering targets (magnetrons) and their use in the sputtering process to coat substrates are described in more detail in U.S. Pat. Nos. 4,422,916; 5,096,562; and 5,922,176, the disclosures of which patents are incorporated herein by reference in their entireties.

Methods used in the past to manufacture targets comprised of a support or backing tube on which the sputtering material has been deposited include plasma spraying, casting, flame spraying and electroplating. In plasma spraying a plasma jet generated in an atmosphere of an inert gas or ambient air is used to spray coat the backing tube, whereas in flame spraying a high pressure gas is used to spray coat the backing tube with a low melting metal such as zinc or tin. Casting typically involves forming a tubular mold around the outer surface of the backing tube and introducing a molten metal in the space between the backing mold and the tube. Once the metal has cooled the mold is removed to form the target. Finally, in electroplating, the backing tube is placed in an electroplating bath and metal ions are deposited on the outer surface of the tube to form the target.

The above-described manufacturing methods are typically used to fabricate targets when a metal is to be used as the sputtering material, and some of these methods can only be used with low melting point metals. However, many instances occur where the desired sputtering material is not a metal and/or cannot be applied by these "buildup" methods. For example, graphite and amorphous carbon are not metals and cannot be easily applied to the surface of a backing or structural tube. Thus, there exists a need for other methods of fabricating sputter targets, especially those that comprise non-metallic sputtering materials.

SUMMARY OF THE INVENTION

In accordance with the invention, it has now been found that rotatable sputter targets comprising graphite, amorphous carbon or other sputtering material difficult to apply to a support tube can be fabricated by (1) placing a support tube inside a prefabricated sleeve of the desired sputtering material so as to form an annular space between the outside surface of the tube and the inside surface of the sleeve, (2) filling the annular space with a thermally conductive material that flows at the fabrication temperature, which is normally the ambient temperature and usually ranges between about 5° C. and about 45° C., and (3) sealing the annular space at or near the ends of the sleeve to inhibit the flowable material from escaping the annular space. Usually, the material filling the annular space is a powder or other particulate material that remains in particulate form at the relatively high temperatures existing during the sputtering process and is both thermally and electrically conductive.

However, the fill material may be any thermally conductive substance that can flow into the annular space at the fabrication temperature regardless of whether the material remains in the same form after the target is made. Examples of such materials include liquids and thixotropic substances such as filled epoxies that cure into a solid adhesive after the target has been fabricated.

Although the sleeve of sputtering material is normally made of graphite or other non-metallic material that is difficult to deposit on a support tube, it can also be made of any metal that is desired as a substrate coating. The support tube may be made of any material that is structurally sufficient to support the sleeve. Examples include stainless steels and carbon—carbon composites. Usually, the support tube is composed of a non-magnetic material.

In one embodiment of the invention, the support tube is a non-magnetic stainless steel, the sleeve is graphite, and the fill material is a graphite powder or other conductive particulate substance that is introduced into the annular space between the tube and the sleeve as the tube and sleeve are vibrated. The ends of the sleeve are typically sealed against the tube with compression rings that attach the sleeve at or near its ends to the tube and prevent the particulate fill material from leaking out of the annular space.

When the length of the sputter target is longer than that of the available sleeve of sputtering material, the sputter target can be made with a plurality of sleeves that are joined together around the support tube so that the end of one sleeve abuts the end of another. The ends of the two outer sleeves are attached to the support tube with compression rings, other mechanical devices, such as flanges and threads, or adhesives.

BRIEF DESCRIPTION OF THE DRAWING

FIG. 1 of the drawing is a partially exploded perspective view of an embodiment of a sputter target of the invention containing two sleeves made of a desired sputtering material; and FIG. 2 is a longitudinal cross-sectional view of the sputter target shown in FIG. 1 taken along the line 2—2.

All identical reference numerals in the FIGS. of the drawing refer to the same or similar elements or features.

DETAILED DESCRIPTION OF THE INVENTION

FIGS. 1 and 2 in the drawing illustrate one embodiment of a sputter target 10 of the invention. The sputter target comprises a hollow support tube 12 that passes through the interior of sleeves or hollow cylinders 14 and 16 of sputtering material in such a manner as to form an annular space 18 between portions of the outer surface of the support tube and portions of the inner surface of each of the two sleeves. The annular space 18 is occupied by a thermally conductive fill material 19, and the two sleeves are attached to the support tube by compression rings 20 and to each other by joint ring 22.

The support tube 12 shown in the FIGS. 1 and 2 is made of a material having sufficient structural strength to enable it to carry the two sleeves of sputtering material as the sputter target is rotated inside a sputtering chamber during the sputtering process. Suitable materials include stainless steels and carbon-carbon composites. Typically, the tube is made of 304 austenitic stainless steel. Normally, the support tube is a hollow cylinder having a wall thickness between about 1.0 and about 8.0 millimeters. The length of the support tube depends on the size of the sputtering equipment in which it is to be used and normally ranges from about 1.0 meter to about 4.0 meters. Typically, the tube is long enough to protrude from the outer ends of sleeves 14 and 16 so that at least one end of the tube can engage a mechanism used to rotate sputter target 10 in the sputtering chamber.

The sleeves 14 and 16 are made of the material that is desired as the coating for the substrates that are passed through the sputtering chamber. Normally, this sputtering material is a non-metal, such as graphite or amorphous carbon, which are difficult to directly apply to a support tube by conventional buildup methods. It should be understood, however, that the sleeves may be made of many other materials if the material is a desired substrate coating. Examples of such other sputtering materials include zinc, silicon, chromium, titanium, and tin.

Each sleeve 14 and 16 typically has a wall thickness between about 4.0 and 25 millimeters, normally between about 8.0 and 15 millimeters. The length of each sleeve depends on the length of the sputter target required to fit the sputtering equipment, the strength of the sputtering material from which the sleeve is fabricated, the ease of sleeve fabrication, and the number of sleeves used in constructing the target. For example, if the sleeve is made by machining a hollow cylinder from a graphite block and the sputter target must fit relatively long sputtering equipment, a plurality of sleeves is normally used because the structural strength of the graphite and the machining process do not lend themselves to the use of a long single sleeve. On the other hand, if the sputtering equipment requires a relatively short target and the sputtering material is a strong metal that can be easily casted or extruded into a hollow cylinder, the use of a single sleeve may be feasible.

Sleeves made of graphite and other non-metals are usually no more than about 3.0 meters long and typically range between about 0.5 and 1.5 meters in length. In general, sleeves made of a metal can be longer than graphite sleeves. Normally, the sleeves are made by casting or extruding the desired sputtering material and not by the isostatic pressing of the desired sputtering material around the support tube. Although sputter target 10 is shown in FIG. 1 as comprised of two separate sleeves, other embodiments of the invention may employ one sleeve, three sleeves, four sleeves and even more if dictated by the sputtering material and the required length of the sputter target.

The sleeve 14 is normally connected to sleeve 16 so that the inner ends of both sleeves abut one another to form a somewhat continuous cylinder of sputtering material. One means of attaching the sleeves to each other is to use joint ring 22. This ring is typically made of the same material as sleeves 14 and 16, is usually between about 10 and about 30 millimeters long, and generally has an inside diameter slightly larger than the outside diameter of the support tube 12 so it can be easily slid over the tube and part way under the first sleeve as is described in more detail below. The second sleeve can then be slipped over the tube so that one end covers the remainder of the joint ring and abuts the inner end of the first sleeve.

The cylinder of sputtering material comprised of the two abutted sleeves 14 and 16 is attached to the support tube 12 by compression rings 20 located at or near the outer ends of each sleeve. These rings, which are normally made of the same material as sleeves 14 and 16, are press fit between the inside of the sleeves and the outside of the support tube. The compression rings 20 usually have the same outside diameter as the joint ring 22 but are typically about one-half as long and have a slightly smaller inside diameter to allow for the press fit. Normally, each end of sleeves 14 and 16 has a precision bore to allow a precise press fit with a compression ring at one end and the joint ring at the other end.

Although compression rings 20 are shown in FIG. 1 and discussed above as the device used to attach sleeves 14 and 16 to support tube 12, it will be understood that other means, both mechanical and chemical, can be used. For example, an adhesive may be used to seal the annular space 18 at or near the outside end of each sleeve and at the same time attach the sleeves to the support tube. Alternatively, other mechanical means such as a flange and thread system can be used for the same purpose.

The annular space 18 that exists between portions of the inside surface of the sleeves 14 and 16 and portions of the outside surface of support tube 12 typically has a width "W" between about 0.5 and 3.0 millimeters, more typically between about 1.0 and 2.0 millimeters, and contains a thermally and electrically conductive fill material 19, usually a particulate material or an adhesive. The fill material typically has a thermal conductivity at room temperature above about 0.5, usually above about 4.0, cal-cm/cm$^2$-sec-° C. and an electrical conductivity above about 10.0 ohm-cm. If the compression rings 20 are electrically conductive, the fill material may not need to be as electrically conductive as set forth above.

The annular space 18 is typically filled with a sufficient amount of thermally conductive material 19 so that heat generated in the sputtering process is effectively conducted from the sleeves 14 and 16 to the cooled support tube 12 during sputtering. When a particulate material, such as a powder, is used in the annular space, at least about 40 volume percent of the space should be filled, but it is more typical that the particulate material occupy over 90 volume percent of the space. Normally, essentially all of the annular space is filled when an adhesive is used as the fill material. The adhesive also typically serves to attach the sleeves to the support tube along with the compression rings. Normally, the material occupying the annular space is not a solder or braze and the sleeves are not welded to the support tube.

Usually, the material 19 occupying annular space 18 is a thermally and electrically conductive powder comprised of particles ranging in size between about 20 and 800 microns. Typically, however, the powder will contain no particles above about 450 microns in diameter and over about 90 weight percent of its particles will range between about 180 and 425 microns in diameter. The powder can be made of the same material as either the support tube 12 or sleeves 14 and 16, or it can be made of a different material that has improved thermal and/or electrical conductivity. Although the powder usually comprises graphite, amorphous carbon or some other non-metal, such as silicon, it can also be a metal. Examples of metals that can be used as the powder include stainless steel, silver, copper, gold, platinum, chrome and zinc. Because of their relatively low cost, non-precious metals are usually employed as the metal powder.

The fill material 19 can also be an adhesive, such as a cured epoxy or a phenolic resin, which contains particulates that are electrically and thermally conductive. Normally, the particulates are a metal powder such as silver, stainless steel, or aluminum. However, other materials that are conductive, such as graphite and silver coated glass beads, can be used. Typically, the particulates comprise between about 40 and about 70 volume percent of the adhesive.

In fabricating the sputter target 10 of the invention, the support tube 12 is stood on one end and attached to a support base, not shown in the figures, to hold the sputter target upright as it is being assembled. A compression ring 20 is place over the top of support tube 12 and forced downward until it is at or near the bottom of the tube. The sleeve 14 is then placed concentrically over the top of the support tube and moved downward until it reaches the compression ring. The bottom end of sleeve 14 typically contains a precision bore extending into the sleeve between about 6.0 and about 16.0 millimeters so that the sleeve can be press fit over the compression ring and thereby attached to support tube 12 in such a manner as to form annular space 18.

A thermally and, preferably, an electrically conductive material 19 is then introduced into the annular space 18 to create a conductive path between the sleeve 14 and support tube 12. In order for the conductive material to be placed into the relatively small annular space, it must flow at the fabrication temperature, i.e., the temperature of the environment surrounding the sputter target as it is assembled. Typically, the conductive material is flowable at a temperature between about 5° C. and 45° C. To ensure that voids in the annular space are filled as the conductive material is introduced into the annular space 18, the support tube 12 and sleeve 14 are normally vibrated as the material is added. The sleeve 14 is held concentric to the support tube during vibration by one or more removable spacers typically located at the top of the sleeve.

The conductive material is usually a particulate material, such as the powder described in detail above. When the sleeve 14 comprising the sputtering material, is graphite, the particulate material introduced into the annular space 18 is usually a graphite powder of the same grade, usually a fine grained graphite such as CXT graphite made by Poco Graphite, Inc of Decatur, Tex.

Other materials that are flowable at the fabrication temperature and can be used as the conductive fill material include liquids and thixotropic substances. An example of a liquid that can be introduced into the annular space is an epoxy, while an example of a thixotropic substance is an epoxy filled with particulates, such as stainless steel particles. Both the plain epoxy and the filled epoxy will cure some time after it is introduced into the annular space, thereby forming an adhesive that serves, in addition to the compression rings 20, to hold the sleeve of sputtering material onto the support tube.

After the annular space 18 between sleeve 14 and the support tube 12 has been substantially filled with the conductive material, the spacers are removed and joint ring 22 is slipped over the top of the support tube and moved downward until it is in contact with the top of sleeve 14. A portion of the joint ring, which is normally twice the length of a compression ring, is then typically press fit into a precision bore, not shown in the figures, at the top of sleeve 14. This precision bore is similar in size to the bore at the bottom of the sleeve into which compression ring 20 is press fit. Next, sputtering sleeve 16, which typically contains precision bores at each end, is placed concentrically over tube 12, moved downward, and press fit onto the uncovered portion of joint ring 22 until it's bottom end abuts the top end of sleeve 14 such that the two sleeve ends are in direct contact with each other.

The annular space formed between the sleeve 16 and support tube 12 is typically filled with the same flowable material used to fill the annular space between sleeve 14 and tube 12. Normally, the same filling procedure is followed, i.e., spacers are used to hold the sleeve 16 concentrically around the tube while the target assembly is vibrated and the flowable material is introduced into the annular space until it is substantially filled. The spacers are then removed and any desired additional sleeves and joint rings are added over the tube in the same manner as described above. If no additional sleeves are needed to reach the desired length of the sputter target, a second compression ring 20 is forced over the tube and press fit into the precision bore at the top of sleeve 16. This second compression ring serves to seal the annular space and to attach the sleeve 16 to tube 12. Usually, a portion of the support tube 12 extends outward from the top of sleeve 16 about the same distance the support tube extends outward from the bottom of sleeve 14.

The assembled sputter target 10 is then removed from the support base, not shown in the figures, and used as the cathode in the sputtering equipment. When the sleeves 14 and 16 are made of solid graphite, the assembled sputter target has sufficient structural strength to allow the sleeves to be machined to a smaller diameter if desired.

Although this invention has been described by reference to several embodiments and to the figures in the drawing, it is evident that many alterations, modifications and variations will be apparent to those skilled in the art in light of the foregoing description. Accordingly, it is intended to embrace within the invention all such alternatives, modifications and variations that fall within the spirit and scope of the appended claims.

I claim:

1. A sputter target comprising:
   (a) a tube;
   (b) a sleeve comprising a sputtering material, said sleeve having an inside diameter greater than the outside diameter of said tube and surrounding said tube in such a manner as to form an annular space between the outside surface of said tube and the inside surface of said sleeve;
   (c) a thermally conductive material at least partially occupying said annular space,
   (d) wherein said thermally conductive material comprises a particulate material.

2. The sputter target defined by claim 1 wherein said particulate material comprises graphite.

3. A sputter target comprising:
   (a) a tube;
   (b) a sleeve comprising a sputtering material, said sleeve having an inside diameter greater than the outside diameter of said tube and surrounding said tube in such a manner as to form an annular space between the outside surface of said tube and the inside surface of said sleeve;
   (c) a thermally conductive material at least partially occupying said annular space, said material comprising an adhesive; and
   (d) wherein said adhesive comprises a cured resin which contains particulates that are electrically and thermally conductive.

4. A sputter target comprising:
   (a) a tube;
   (b) a sleeve comprising a sputtering material, said sleeve having an inside diameter greater than the outside diameter of said tube and surrounding said tube in such a manner as to form an annular space between the outside surface of said tube and the inside surface of said sleeve;
   (c) a thermally conductive material at least partially occupying said annular space,
   (d) wherein said thermally conductive material comprises an adhesive; and
   (e) wherein said adhesive comprises a phenolic resin.

5. A sputter target comprising
   (a) a tube;
   (b) a sleeve comprising a sputtering material, said sleeve having an inside diameter greater than the outside diameter of said tube and surrounding said tube in such a manner as to form an annular space between the outside surface of said tube and the inside surface of said sleeve;
   (c) a thermally conductive material at least partially occupying said annular space,
   (d) wherein said thermally conductive material comprises an adhesive; and;
   (e) wherein said adhesive comprises an epoxy filled with thermally conductive particulates.

6. A rotatable, substantially cylindrical sputter target comprising:
   (a) a cylindrical tube;
   (b) a cylindrical sleeve comprising a sputtering material, said sleeve having an inside diameter greater than the outside diameter of said tube and surrounding said tube in such a manner as to form an annular space between the outside surface of said tube and the inside surface of said sleeve; and
   (c) an electrically and thermally conductive particulate material at least partially occupying said annular space.

7. The sputter target defined by claim 6 wherein said particulate material comprises metal particles.

8. The sputter target defined by claim 6 wherein said particulate material comprises graphite particles.

9. The sputter target defined by claim 6 wherein the particles comprising said particulate material range in size between about 20 and about 800 microns.

10. The sputter target defined by claim 6 wherein said sleeve is attached to said tube by compression rings that substantially prevent said particulate material from escaping from said annular space.

11. The sputter target defined by claim 6 wherein said thermally conductive particulate material occupies substantially all of said annular space.

12. A sputter target comprising:
    (a) a tube;
    (b) a sleeve comprising a sputtering material, said sleeve having an inside diameter greater than the outside diameter of said tube and surrounding said tube in such a manner as to form an annular space between the outside surface of said tube and the inside surface of said sleeve;
    (c) a thermally conductive material at least partially occupying said annular space, wherein said material is selected from the group consisting of particulate materials and adhesives; and
    (d) wherein the sputter target comprises a plurality of said sleeves.

13. A sputter target comprising:
    (a) a tube;
    (b) a sleeve comprising a sputtering material, said sleeve having an inside diameter greater than the outside diameter of said tube;
    (c) means for attaching said sleeve to said tube in such a manner as to form an annular space between the outside surface of said tube and the inside surface of said sleeve; and (d) a thermally and electrically conductive material at least partially occupying said annular space, wherein said material is selected from the group consisting of particulate materials and adhesives.

14. The sputter target defined by claim 13 wherein said conductive material comprises particles of graphite.

15. The sputter target defined by claim 14 wherein said sleeve comprises graphite.

16. A sputter target comprising:
   (a) a tube;
   (b) a sleeve comprising a sputtering material, said sleeve having an inside diameter greater than the outside diameter of said tube and surrounding said tube in such a manner as to form an annular space between the outside surface of said tube and the inside surface of said sleeve;
   (c) a thermally conductive material at least partially occupying said annular space,
   (d) wherein said thermally conductive material comprises a particulate material;
   (e) wherein said particulate material comprises graphite; and
   (f) wherein s aid sleeve comprises graphite.

* * * * *